(12) United States Patent
Ishigame

(10) Patent No.: US 6,499,936 B2
(45) Date of Patent: Dec. 31, 2002

(54) TRANSFER SYSTEM

(75) Inventor: Tooru Ishigame, Tokyo (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 09/788,141

(22) Filed: Feb. 17, 2001

(65) Prior Publication Data

US 2002/0114690 A1 Aug. 22, 2002

(51) Int. Cl.[7] .............................................. B66C 23/00
(52) U.S. Cl. ......................... 414/744.5; 901/15; 901/21
(58) Field of Search ......................... 414/744.5; 901/15, 901/21

(56) References Cited

U.S. PATENT DOCUMENTS

| | | | | |
|---|---|---|---|---|
| 4,909,701 A | * | 3/1990 | Hardegen et al. ........... 414/749 |
| 5,147,175 A | * | 9/1992 | Tada ........................... 414/749 |
| 5,180,276 A | * | 1/1993 | Hendrickson ............... 414/749 |
| 5,725,352 A | * | 3/1998 | Tanaka ..................... 414/741.5 |
| 5,743,704 A | * | 4/1998 | Caveney et al. .......... 414/744.5 |
| 5,971,701 A | * | 10/1999 | Kawamura et al. ......... 414/800 |
| 6,098,484 A | * | 8/2000 | Bacchi et al. ............. 74/490.03 |
| 6,224,319 B1 | * | 5/2001 | Velikov et al. .......... 414/744.5 |

\* cited by examiner

Primary Examiner—Kathy Matecki
Assistant Examiner—Michael Lowe
(74) Attorney, Agent, or Firm—Moonray Kojima

(57) ABSTRACT

A transfer system used in transferring a semiconductor from one process to another process during manufacture, and comprising first and second upper arms and first and second forearms assembled to form a frog-legs like structure, with the first and second forearms being linked to a forearm link, and a transfer hand attached to the forearm link; wherein the transfer hand is moved by associating the first upper arm motion with the first and second forearm motions, and by associating the second upper arm motion with the first and second forearm motions.

6 Claims, 16 Drawing Sheets

66 FOREARM  62 UPPER ARM
61 UPPER ARM  67 FOREARM

TRANSFER SYSTEM

BACKGROUND OF THE INVENTION

1. Field of Invention

This invention relates to a transfer system used for transfer of wafers in a semiconductor manufacturing line, or the like.

2. Description of the Prior Art

In the manufacture of semiconductors, for example, a transfer system is used to move an object being processed, such as a semiconductor wafer, from one process to another process. Examples of conventional transfer systems are discussed below.

First Conventional Transfer System

FIG. 1 shows a first example of a conventional transfer system, wherein two upper arms 11,12 are positioned on a drive shaft 13. Drive shaft 13 is designed to be driven by rotation. Upper arms 11,12 are linked to drive shafts 14,15. Upper arms 11,12 rotate on drive shaft 13. To the tip of upper arm 11, forearms 16,17 are rotatably mounted. To the tip of upper arm 12, forearms 18,19 are rotatably mounted. Platform 20 is linked to the tips of forearms 16,18. Platform 21 is linked to the tips of forearms 17,19. The four forearms 16–19 are assembled to form a pair of frog-legs like structure. Platforms 20,21 are positioned depending on the rotated angles of upper arms 11,12.

Operation of the system of FIG. 1 is as follows. By turning two upper arms 11,12 in opposite directions, one platform (20 or 21) moves in a direction away from drive shaft 13 (i.e. the distance from drive shaft 13 is increased) and the other platform (21 or 20) is moved only slightly from its standby position. The other platform stays approximately at the same position as the standby position, wherein the standby position is a position disposed above drive shaft 13.

In addition, by rotating drive shaft 13, the orientation of the frog-legs like structure is changed. This makes the extending direction of platforms 20 and 21 change. From these operations, two wafers are transferred by (a) selecting either of platforms 20 and 21, and (b) then extending or contracting that platform which is selected depending on the angle formed with the upper arms 11 and 12. Drive shaft 13 is rotated when a wafer, upon which processing is completed, is removed from the process using a platform and then is transferred to another process.

However, the conventional system of FIG. 1 has certain problems. For example, if the direction of extension of platforms 20,21 is to be changed, drive shaft 13 is rotated with the platforms 20,21 being placed in the standby position. In order to ensure that platforms 20, 21 do not contact adjacent machines, equipment, etc, the turning radius of the platforms 20,21 must be small. In that case, platforms 20,21 must be made to move close to drive shaft 13, which limits the thickness of the forearms 16–19. Hence, the forearms must be made to be very thin, and suitable rigidity cannot be achieved. Accordingly, due to the weight of the wafers and platforms, the forearms are subjected to bending, and stable transfer is prevented from occurring and speed of transfer cannot be increased.

Second Conventional Transfer System

FIG. 2 shows a second conventional transfer system wherein first arm 32 is arranged rotatably around rotating shaft 31; second arm 34 is arranged rotatably around rotating shaft 33 located on the tip of first arm 32; and third arm 36 is arranged rotatably around rotating arm 35 located on the tip of second arm 34. The center of rotation of third arm 36 is at the midpoint thereof. First arm 32 is rotated by being directly coupled to a first motor (not shown). Second arm 34 and third arm 36 are rotated by a second motor and a third motor (not shown) via pulleys and belts. The second conventional transfer system has Selective Compliance Assembly Robot Arm (also called "SCARAB") types of arms. The test object mounting parts 37,38, on which test objects are disposed, respectively, are provided at both ends of third arm 36.

Operation of the FIG. 2 system is as follows. The stand by position is a position whereat first arm 32 and second arm 34 overlap each other. Rotation of first arm 32 in one direction causes test object mounting part 37 or 38 disposed on either tip of third arm 36 to be placed in an extended position which is furthest from rotating shaft 31. The other test object mounting part, located on the opposite side, is positioned in a place nearer to the rotating shaft 31 than the test object mounting part located furthest away. Rotation of first arm 32 in the opposite direction moves the test object mounting part on the opposite side to the furthest extended position via the stand by position. In addition, the extending direction of a test object mounting part is set at an arbitrary angle by turning the system around rotating shaft 31. Accordingly, two wafers are transferred to other places by moving the two test object (e.g. wafers) mounting parts to the standby position or the furthest extended position.

However, the second conventional transfer system has the following problems. First arm 32 and second arm 34 are provided with a sealed barrier to exclude particles generated or provided by wear of the bearings that support the belts and pulleys used therein, in order to obtain the degree of cleanliness required for semiconductor manufacture. Also, the width of the belts depend on the strength required for transmitting power. Accordingly, thicker arms must be used to insure provision of the required width of the belts, and to provide barrier construction.

Moreover, in SEMI E21 and SEMI E22 standards, which are the standards generally followed in the industry to manufacture semiconductors, standard dimensions of the arms are provided. Specifically, the thickness of the hands in the interface zones for engaging test objects is defined to be 23 mm for wafers up to 8 inches; that is, a very thin dimension is required by the industry standards. In the FIG. 2 system, the coupling part of the second arm 34 and third arm 36 correspond to this zone. Making the thickness of the coupling part to be 23 mm or less and providing barriers incorporating the belts and pulleys and bearings in the arms, result in fragile construction of the arms. Thus, in the prior art, the required arm thickness cannot be satisfied for such arm construction. Moreover, the arms are likely to become bent due to the weight of the wafers and the test object mounting parts, because the arms must be designed to be thin. Thus, stable transfer of wafers from one process to another cannot be assured.

Third Conventional Transfer System

FIG. 3 shows a third conventional transfer system, wherein two forearms 43,44 are rotatably mounted on the tips of rear arms 41,42. Transfer base 45 is linked to the tips of forearms 43,44 using hinges 46,47. The structure resulting from such construction is a frog-legs shaped structure. Rear arms 41,42 are rotated by gears 48,49 that rotate in opposite directions to each other and in synchronism. Forearms 43,44 are each rotated by pulleys 50,51 having an effective diameter ratio of 2 to 1, and tension belt 52 is stretched between both pulleys 50,51. Pulley 50 is tightly fixed in a coaxial manner to gears 48,49. Pulley 51 is tightly fixed in a coaxial manner to hinges 53,54.

Operation of the FIG. 3 system is as follows. Forearms 43,44 are rotated to an angle 2α, which is twice the deflection angle α of each of rear arms 41,42 when the rear arms are rotated in opposite directions to each other and transfer base 45 is positioned. The rotating angles and rotating directions of the forearms, which are restricted by pulleys 50,51 and belt 52, correspond to the rotating positions of the rear arms. Hence, transfer base 45 is positioned by the rotation of each rear arm in the range of ±90° in opposite directions starting at the condition where each of the forearms and rear arms overlap.

The FIG. 3 system has the following problems, however. The arm construction is equivalent to the case where two SCARA type robots are placed in parallel. Thus, it is a mere addition of a power transmitter such as gears 48,49 that cause rear arms 41,42 to turn in opposite directions and use the arm driving motor commonly.

The two rear arms must be arranged to be close to each other and hence thick gears 48,49 cannot be used. Hence, bearing rigidity is lowered, and the arms are thin. Accordingly, the arms are likely to become bent and stable transfer is not possible. Also, if wafers are transferred in vacuum, the drive shaft must be vacuum sealed also. However, if the gears 48,49 linking the two rear arms 41,42 are required to be independent of each other, each must be separately sealed. Thus, additional maintenance time and labor would be required.

Moreover, considering the relationship between the arms and the motors, to move the arrangement either in the arm extending direction (called "R-axis" direction) or in the arm turning direction (called "θ-axis" direction), the foregoing systems are provided with an R-axis motor and a θ-axis motor. When extending or engaging in the construction, one of the motor is operated while the other motor is not operated. Accordingly, availability of the motors leaves much to be desired.

SUMMARY OF THE INVENTION

Accordingly, an object of the invention is to overcome the aforementioned and other problems, disadvantages and deficiencies of the prior art.

Another object is to provide a transfer system which provides stable transfer operation and wherein maintenance is simplified and energy consumption is reduced.

DETAILED DESCRIPTION OF THE PREFERRED EMBODIMENTS

EMBODIMENT 1.

Figure 1:
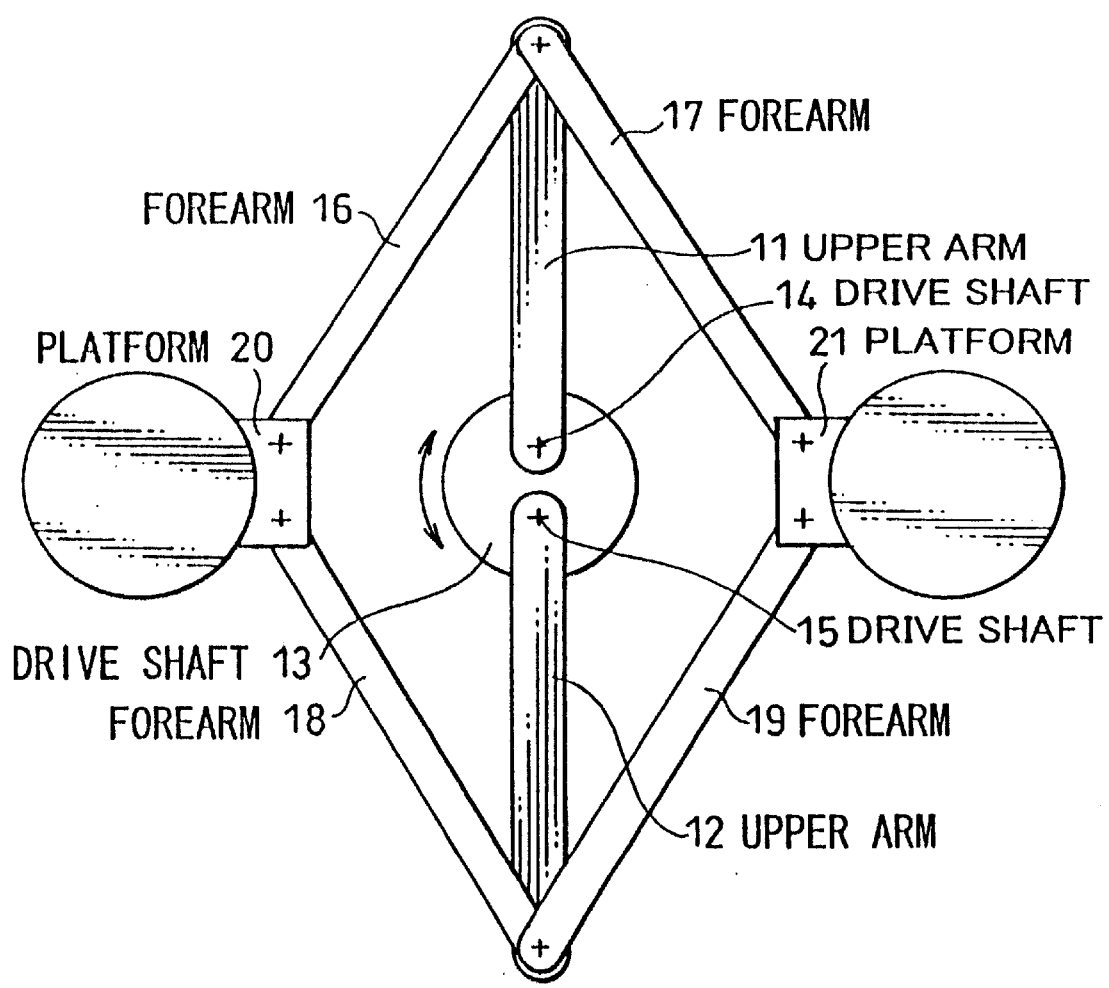
FIG. 1 is a plan view depicting a first conventional transfer system.
Figure 2:
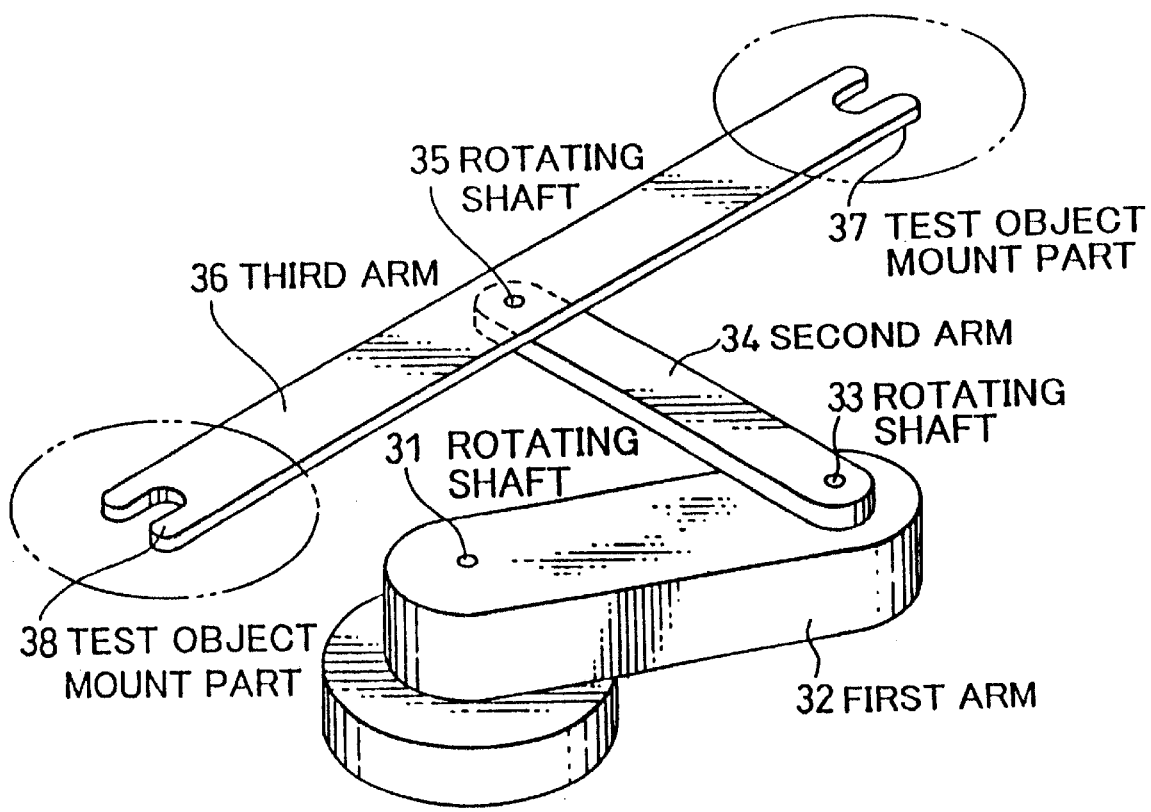
FIG. 2 is a plan view depicting a second conventional transfer system.
Figure 3:
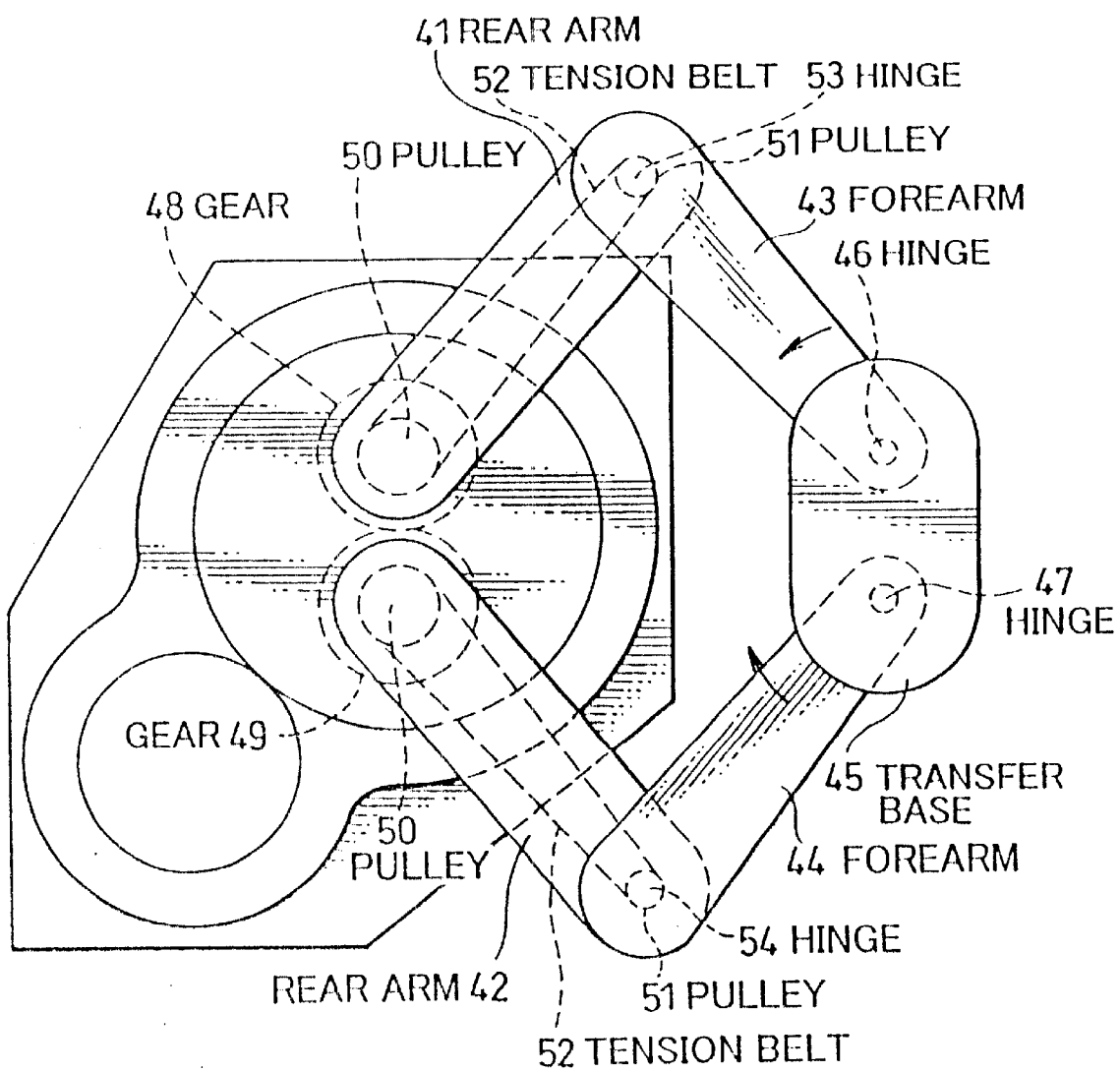
FIG. 3 is a plan view depicting a third conventional transfer system.
Figure 4:
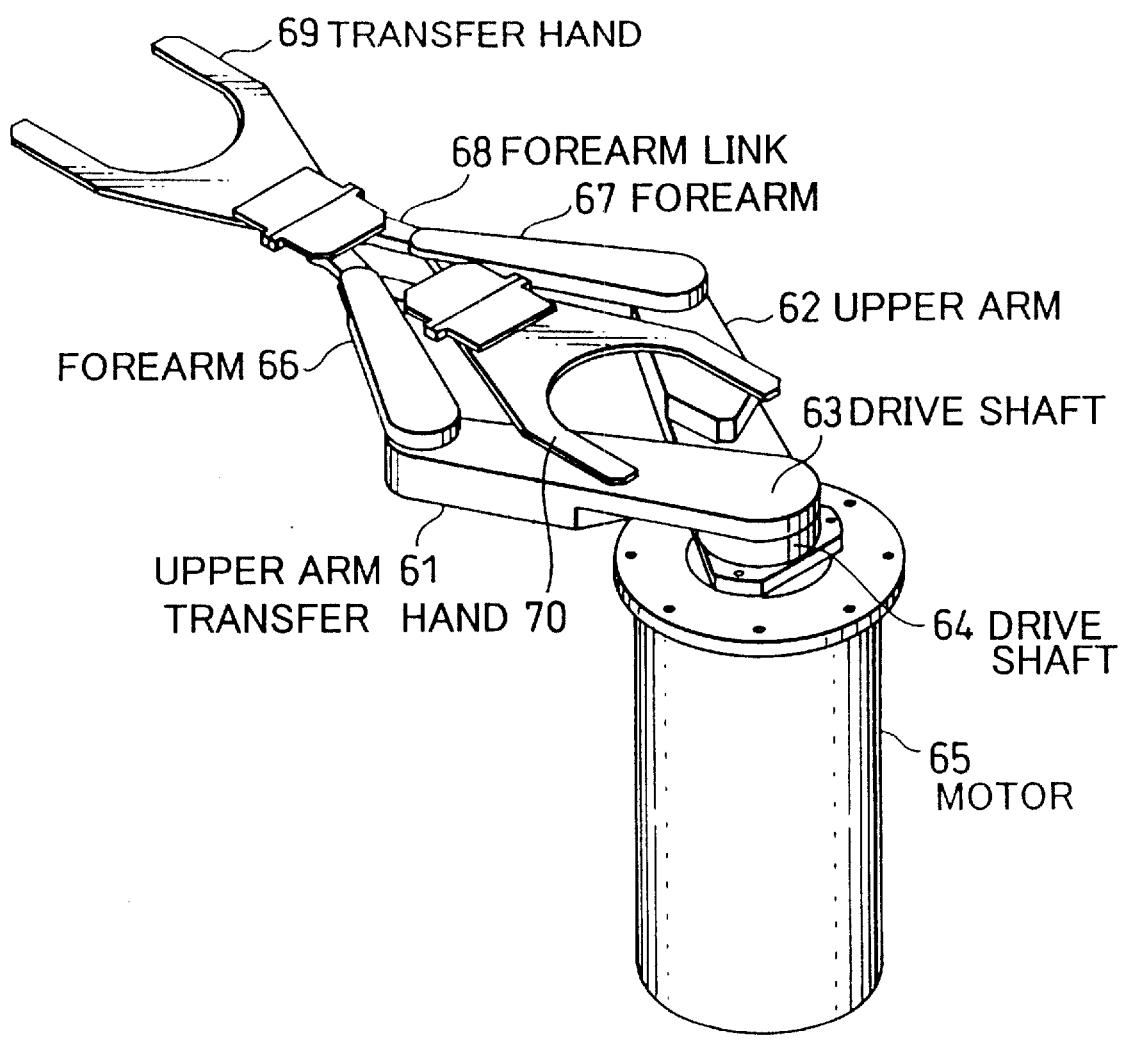
FIG. 4 is a perspective view depicting a first illustrative embodiment of the invention.
Figure 5:
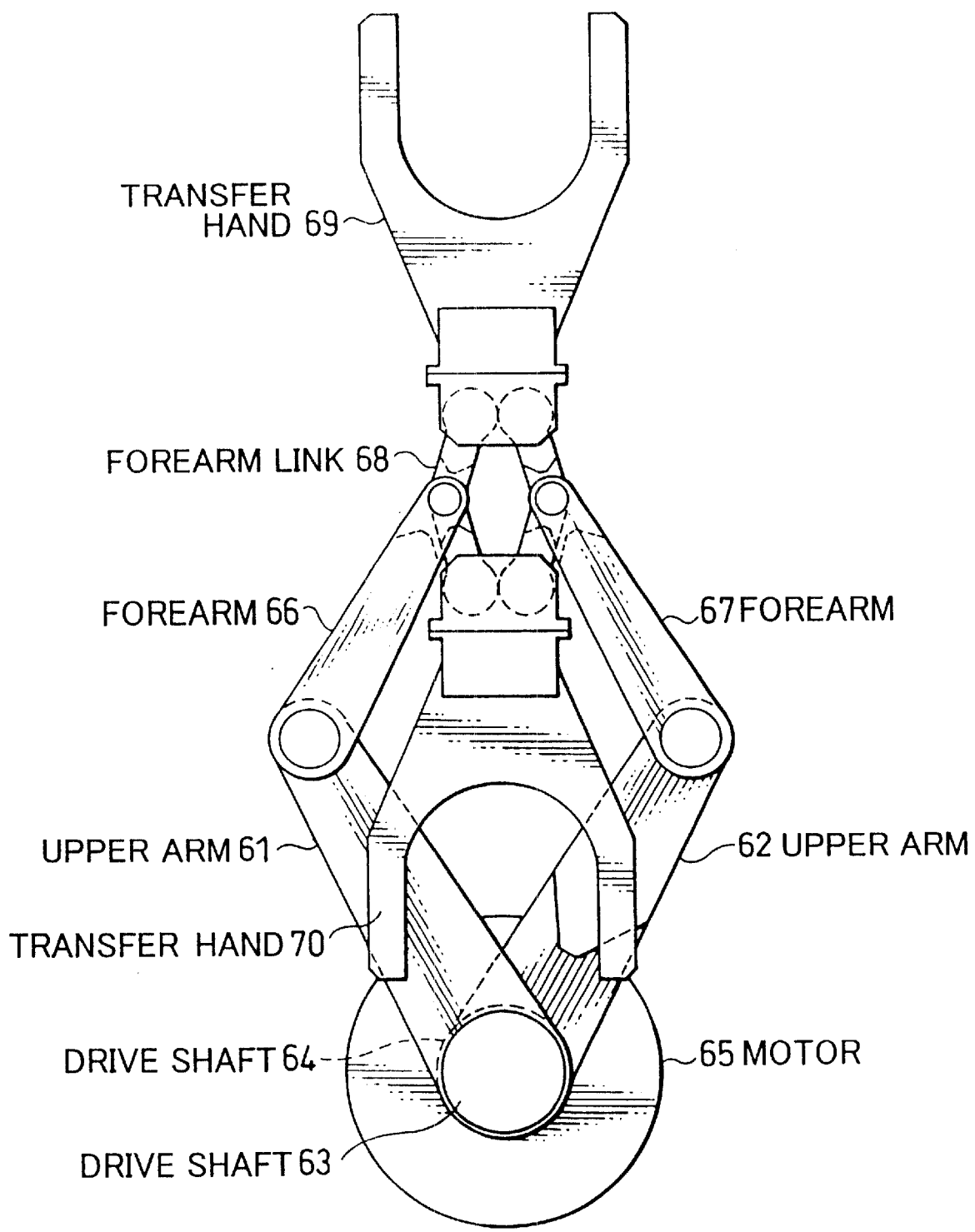
FIG. 5 is a plan view depicting the embodiment of FIG. 4.

FIG. 4 is a perspective view, and FIG. 5 is a plan view, depicting an illustrative embodiment of the invention transfer system comprising upper arms 61,62, each being rotatable in a coaxial manner; drive shafts 63,64 for driving upper arms 61,62, respectively; and motor 65, which is a two shaft motor having two output shafts driven independently of each other. The two output shafts of motor 65 are directly coupled to drive shafts 63,64, respectively. The output shafts of motor 65 are arranged in a coaxial manner. Motor 65 is, for example, a motor disclosed in Japan SN Hei 3/16597. The base end of forearm 66 is mounted rotatably on the tip end of upper arm 61. The base end of forearm 67 is mounted rotatably on the tip of upper arm 62. Both tip ends of forearms 66,67 are linked to forearm links 68. Transfer hands 69, 70 are attached to forearm links 68 and are arranged in different transfer directions to each other.

Figure 6:
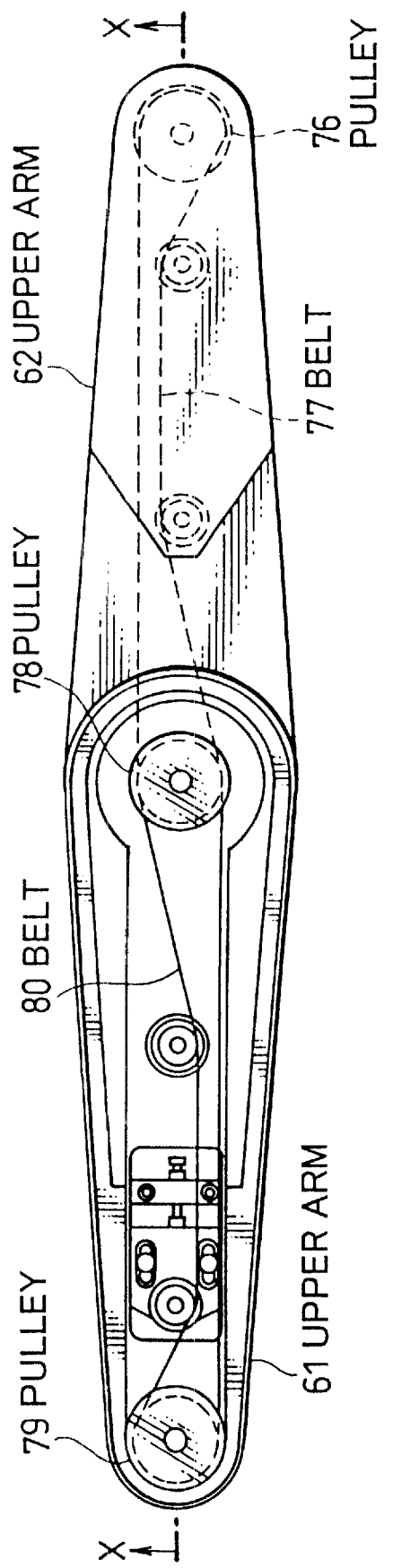
FIG. 6 is a drawing depicting a power transmission mechanism in the embodiment of FIG. 4.
Figure 7:
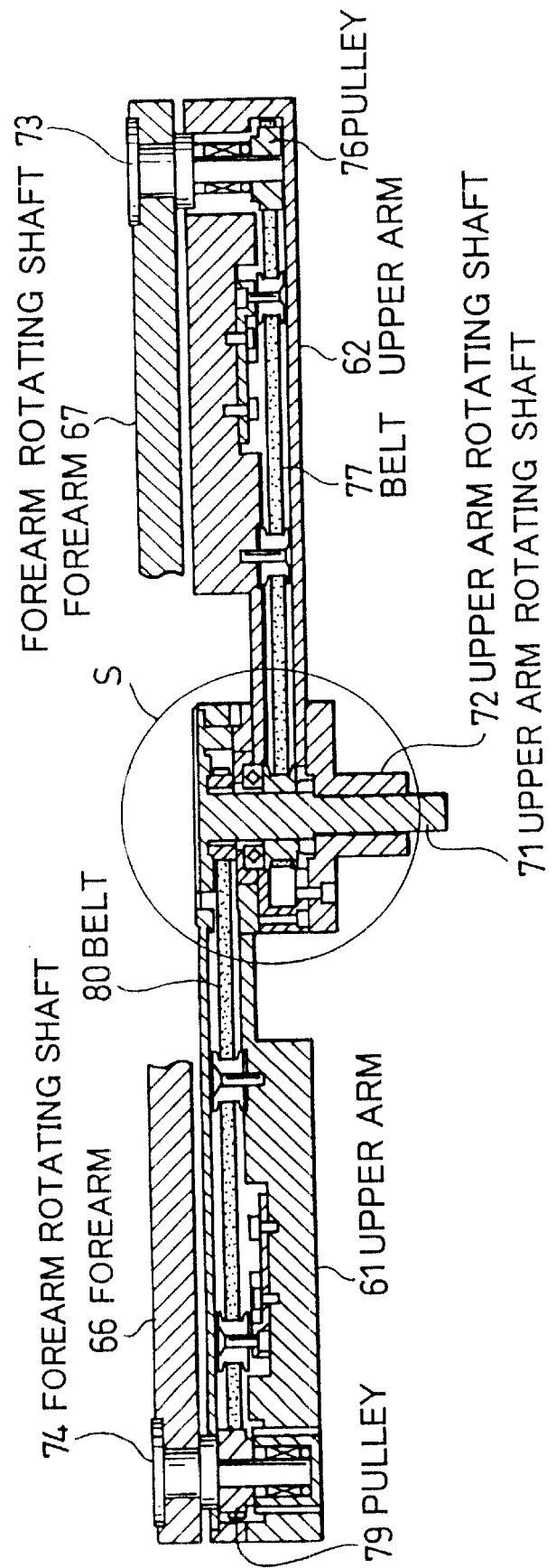
FIG. 7 is a drawing depicting another power transmission mechanism used in the embodiment of FIG. 4.
Figure 8:
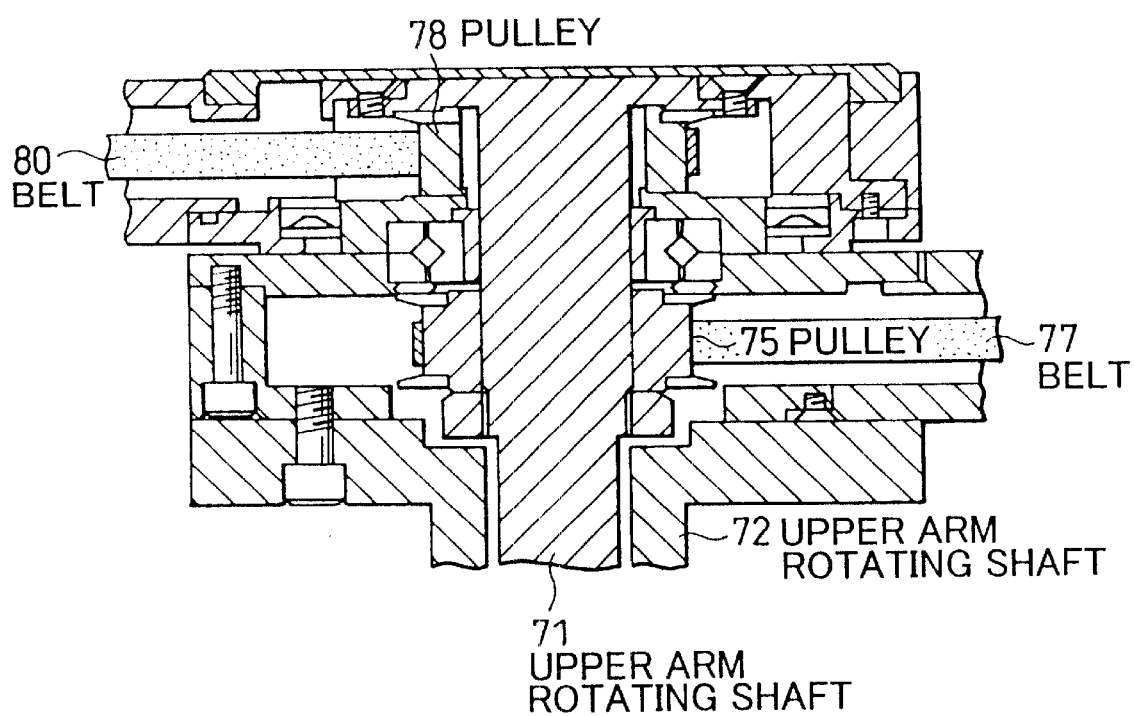
FIG. 8 is a drawing depicting a further power transmission mechanism used in the embodiment of FIG. 4.
Figure 9:
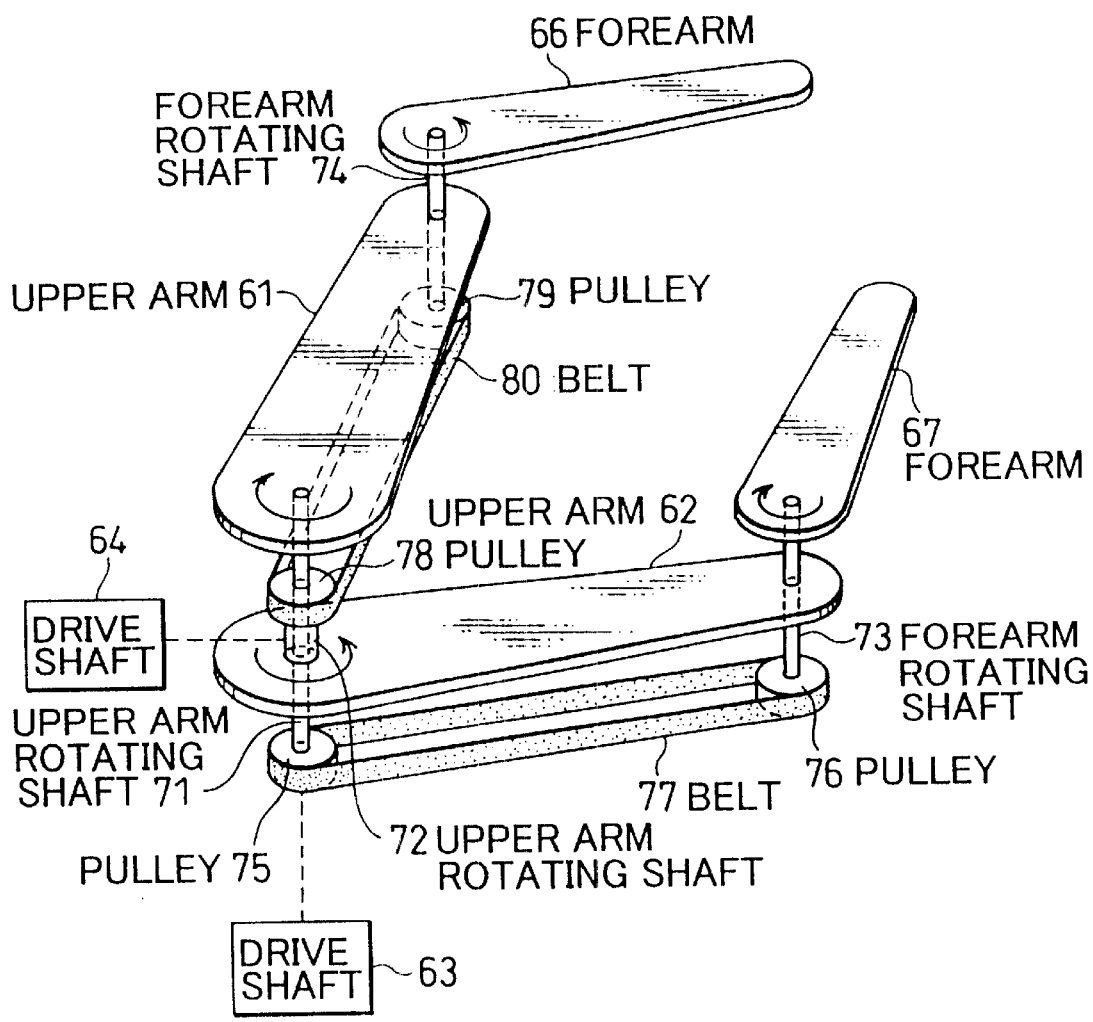
FIG. 9 is a perspective view depicting yet further power transmission mechanism used in the embodiment of FIG. 4.

An example of the power transmission mechanism used in the transfer system of FIG. 4 will be described with reference to FIGS. 6–9, wherein FIGS. 6–8 show cross sectional views of the power transmission mechanism and FIG. 9 shows a perpective view thereof. FIG. 6 shows an upper arm; FIG. 7 shows a cross section taken along line X—X in FIG. 6; and FIG. 8 shows an enlarged part S of FIG. 7.

In. FIGS. 6–9, upper arm drive shafts 71, 72 are arranged in a coaxial manner, with upper arm drive shaft 71 being coupled to upper arm 61 and upper arm drive shaft 72 being coupled to upper arm 62. Forearm 67 is coupled to forearm drive shaft 73 provided at the tip end of upper arm 62. Forearm 66 is coupled to forearm drive shaft 74 provided at the tip end of upper arm 61.

Drive shaft 63 is linked to upper arm drive shaft 71 and transmits power to upper arm 61 via upper arm drive shaft 71. Drive shaft 62 is linked to upper arm drive shaft 72 and transmits power to upper arm 62 via upper arm drive shaft 72. Pulley 75 is coupled to upper arm drive shaft 71 and pulley 76 is coupled to forearm drive shaft 73. Belt 77 is held by pulleys 75,76. The torque of drive shaft 63 is transmitted to upper arm 61 via upper arm drive shaft 71. The torque of drive shaft 63 is also transmitted to forearm 67 via upper arm drive shaft 71, pulley 75, belt 77, pulley 76, and forearm drive shaft 73. Upper arm 61 and forearm 67 are driven in association with each other because of the foregoing configuration.

In a similar manner, pulley 78 is coupled Do upper arm drive shaft 72 and pulley 79 is coupled to forearm drive shaft 74. Belt 80 is held by pulleys 78,79. The torque of drive shaft 64 is transmitted to upper arm 62 via upper arm drive shaft 72. The torque of drive shaft 64 is also transmitted to forearm 66 via upper arm drive shaft 72, pulley 78, belt 80, pulley 79, and forearm drive shaft 74. Upper arm 62 and forearm 66 are driven in association with each other because of the foregoing configuration.

When any of the upper arms is rotated, the relative angle between upper arm 61 and upper arm 62 is varied. Accordingly, when drive shaft 63 is rotated, upper arm 61 and forearm 67 are rotated in the same direction. At the same time, forearm 66 is relatively rotated in the opposite direction. Since the positions of pulleys 78,79 around which belt 80 is disposed vary by the rotation of upper arm 61, forearm 66 is thus rotated. In a similar manner, when drive shaft 64 is rotated, upper arm 62 and forearm 66 are rotated in the same direction. At the same time forearm 67 is relatively rotated in the opposite direction.

The ratio of radii of pulleys 75,76 and the ratio of radii of pulleys 78,79 are both 1:1. When upper arm 62 is rotated, the above factors make forearm 66 rotate by the same angle as upper arm 62 and in the same direction, and hence makes forearm 67 rotate by the same angle in the opposite direction. Also, when upper arm 61 is rotated, forearm 67 is rotated by the same angle as the upper arm 61 and in the same direction, and forearm 66 is rotated by the same angle in the opposite direction. Although in this case, the ratio of radii of the pulleys is 1:1, other ratios can be used.

As shown in FIGS. 6–9, the upper arms 61,62 rotate in a coaxial manner, and each bearing is stacked on the drive shafts. Thus, the values of the shaft diameters are not specifically restricted and can be suitably selected depending on, for example, the load.

In addition, the four arms of upper arms 61,62 and forearms 66, 67, are positioned in a stacked manner. Thus, their moving regions for rotation do not interfere: with each other. Also, this does not restrict the horizontal arm widths orthogonal to the drive shafts. Hence, the arm widths can be set according to the load. Also, since there are no pulleys and belts inside the forearms 66,67, thin forearms can be used which easily comply with the standards of SEMI E21 and SEMI E22. Furthermore, the fact that the drive shaft comprises two shafts which are arranged coaxial to each other, simplifies the transmission mechanism because the motor shafts can then be directly coupled to the mechanism. Moreover, vacuum sealing is easy to implement in an evacuated atmosphere, and simple construction of the invention improves servicing and maintenance.

Figure 10A:
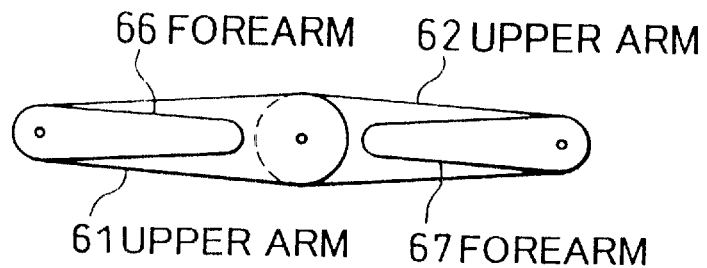
FIGS. 10A–10C are drawings depicting operation of the embodiment of FIG. 4.
Figure 10B:
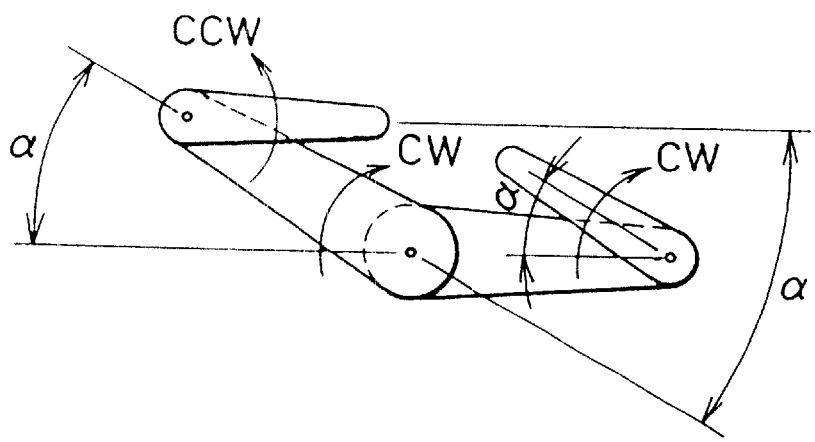
Figure 10C:
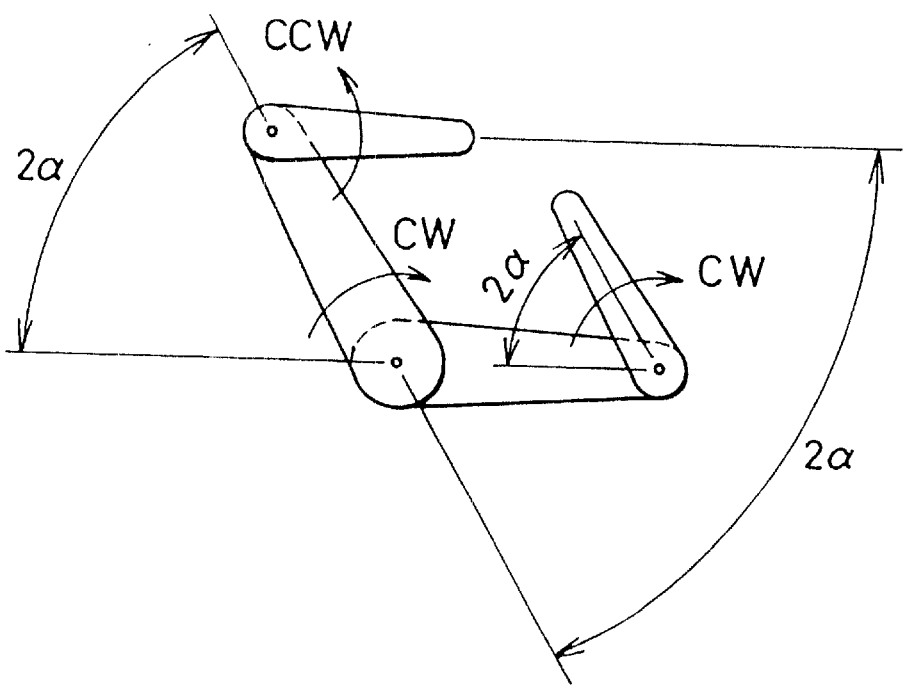

Operation of the embodiment of FIGS. 4–9 is described with reference to FIGS. 10 and 11, wherein operation is described in FIG. 10 when any one upper arm is rotated, and wherein operation is described in FIG. 11 when two upper arms are rotated in opposite directions. FIG. 10A shows a standby position; FIG. 10B shows an extended position wherein the upper arm is rotated by angle α; and FIG. 10C shows an extended position wherein the upper arm is rotated by angle 2α. The radius ratio of pulleys 75,76 and that of pulleys 78,79 are both assumed to be 1:1.

Figure 11A:
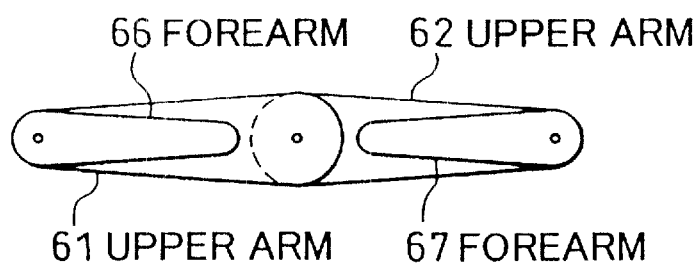
FIGS. 11A–11C are drawings depicting operation of the embodiment of FIG. 4.
Figure 11B:
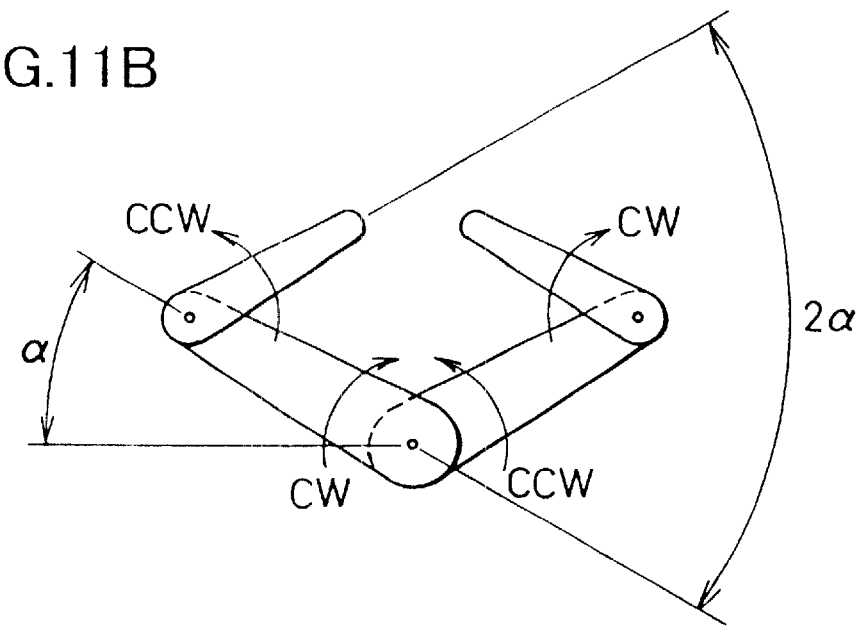
Figure 11C:
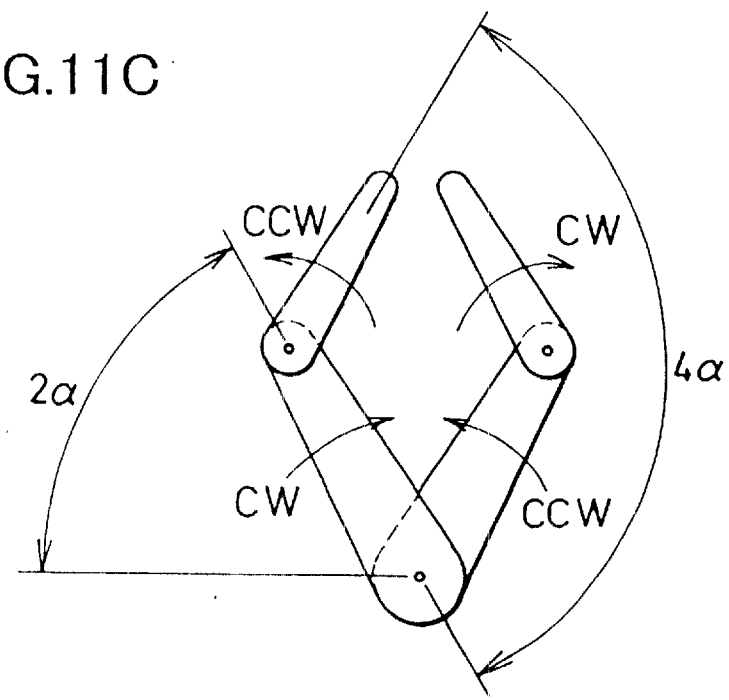

In the standby position (starting point being at angle zero) of FIG. 10A, forearms 66,67 and upper arms 61,62 are stacked in a straight line. Rotating centers of each arm are positioned on a straight line. In FIG. 10B, when upper arm 61 is rotated by angle α clockwise (Cw), forearm 67 is rotated by angle α clockwise (Cw) and forearm 66 is relatively rotated by angle α counterclockwise (CCW). In FIG. 10C when upper arm 61 is rotated by angle α clockwise (CW), forearm 67 is rotated by angle 2α clockwise (CW) and forearm 66 is relatively rotated by angle 2α counterclockwise (CCW). The conditions shown in FIGS. 11A–11C are similar to conditions shown in FIGS. 10A–10C. the standby position (starting point being at angle zero) of FIG. 11A is the same as that shown in FIG. 10A. In FIG. 11B, when upper arm 61 and upper arm 62 are rotated by angle α clockwise (CW) and counterclockwise (CCW), respectively, forearm 67 and forearm 66 are rotated by angle α clockwise (CW) and counterclockwise (CCW) respectively. In FIG. 11C, when upper arm 61 and upper arm 62 are rotated by angle 2α clockwise (CW) and counterclockwise (CCW), respectively, forearm 67 and forearm 67 are rotated by angle 4α clockwise (CW) and counterclockwise (Ccw), respectively.

When the radius ratios of the pulleys are 1:1, upper arm 61 and forearm 67 are always parallel to each others assuming that errors in pulley diameters and elongation of belts are neglected, and similarly, upper arm 62 and forearm 66 are also retained parallel to each other. Also, when FIG. 10C is compared with FIG. 11C, the relative positions of the upper arms and the forearms show the same attitude in both cases, only by rotating upper arms by angle α. This shows that, even when either one or both of the upper arms are rotated, the attitude of the upper arms and the forearms depends on the relative angle between the upper arms 61 and 62. According to the rotation angle of the upper arms 61,62, the rotation angle of the pair of forearms 66,67 is uniquely determined.

In FIGS. 10A–10C and 11A–11C, the case where upper arm 61 is rotated clockwise (CW) starting at the standby position as an example is described. However, the situation is the same when upper arm 61 is rotated counterclockwise (CCW). In this case, the attitude of forearms relative to the upper arms is also uniquely determined. Accordingly, depending on the rotating direction of upper arms 61,62 turning in opposite directions, the arms can be operated in both directions making a straight line connecting the rotating centers of the upper arms and the forearms in the attitude in the standby position of FIG. 10A and FIG. 10B, as the axis of symmetry.

Figure 12:
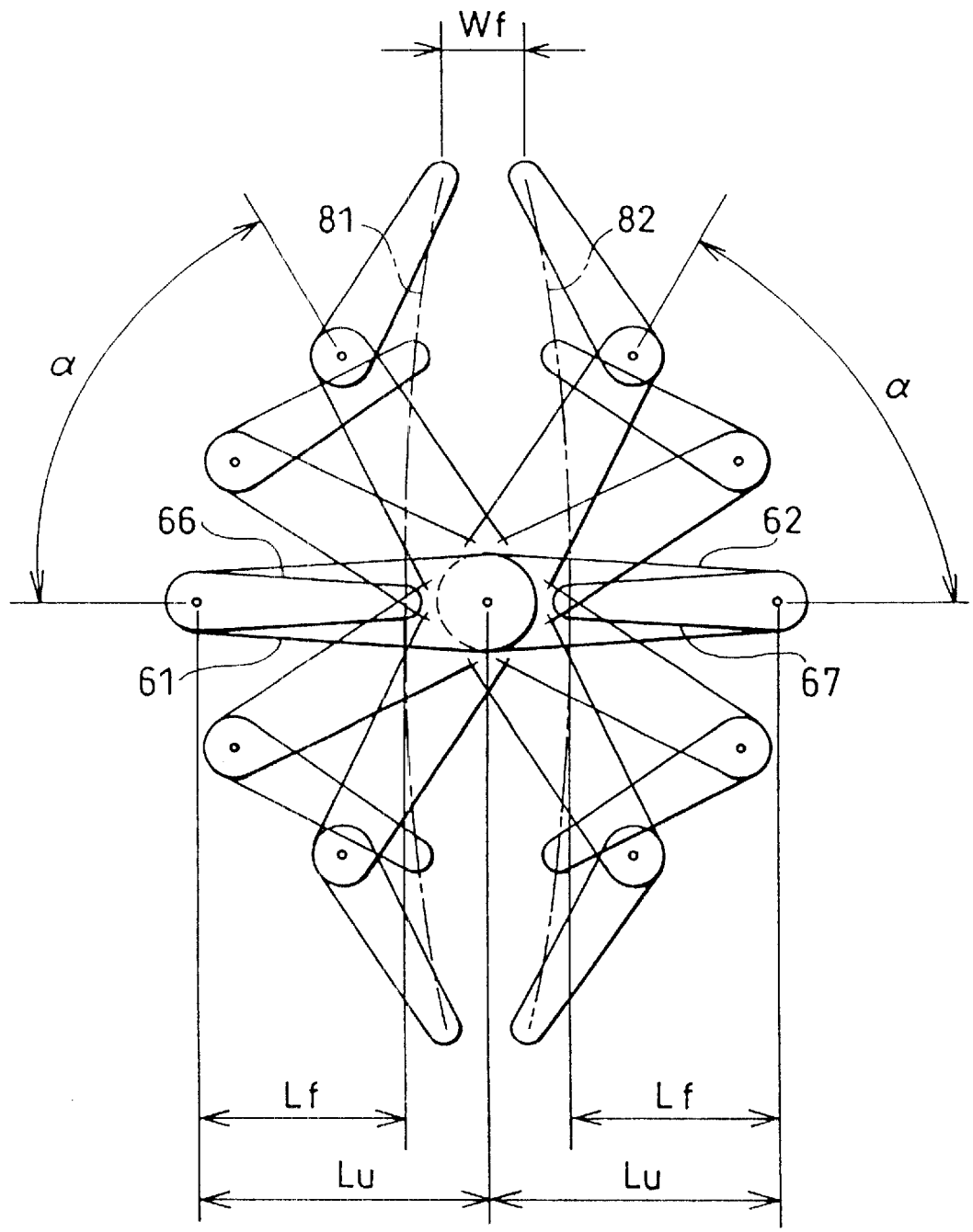
FIG. 12 is a drawing depicting operation of the embodiment of FIG. 4.

FIG. 12 shows the loci of upper arms 61,62 and forearms 66,67 when they are operated in both directions. In this case, let the length from the rotating center of upper arm 61 to the rotating center of forearm 66 be "Lu"; and let the length from the rotating center of the forearm 66 to an arbitrary tip end of forearm 66 be "Lf", and let the rotating angle of forearm 67 be α. Also, assume that the same definition applies to the relation between upper arm 62 and forearm 67. Then, the distance Wf between the arbitrary tip ends located on forearms 66 and 67 can be determined using the equation:

$$2\times(Lu\cdot\cos\alpha - Lf\cdot\cos\alpha)$$

when the radius ratios of the pulleys are 1:1. Hence, the positions of arbitrary tip ends of forearms 66,67 based on the rotation of the upper arms 61 and 62 take courses expressed by the loci 81,82 and the distances thereof are uniquely determined.

Figure 13A:
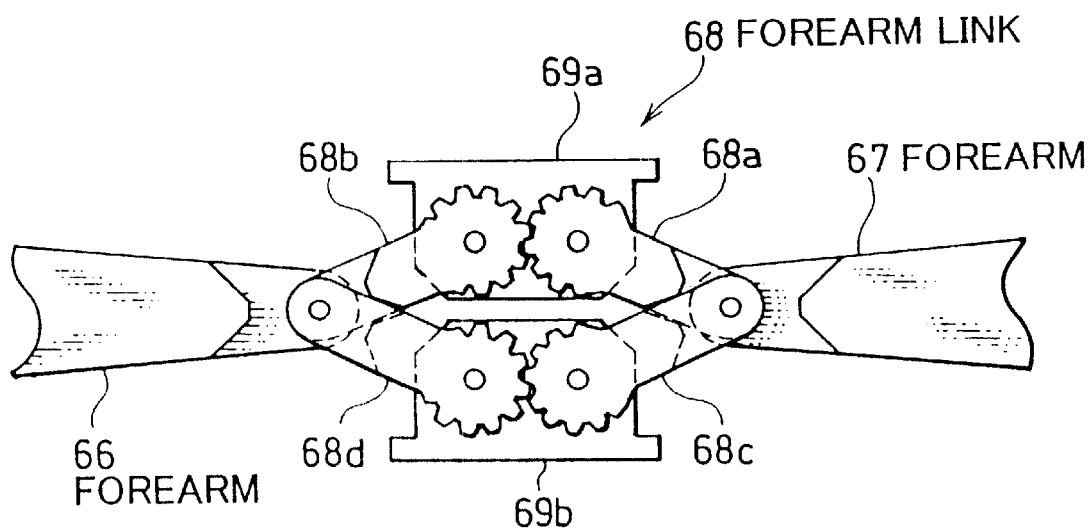
FIGS. 13A and 13B are drawings depicting an exemplary configuration of a forearm link of the invention.
Figure 13B:
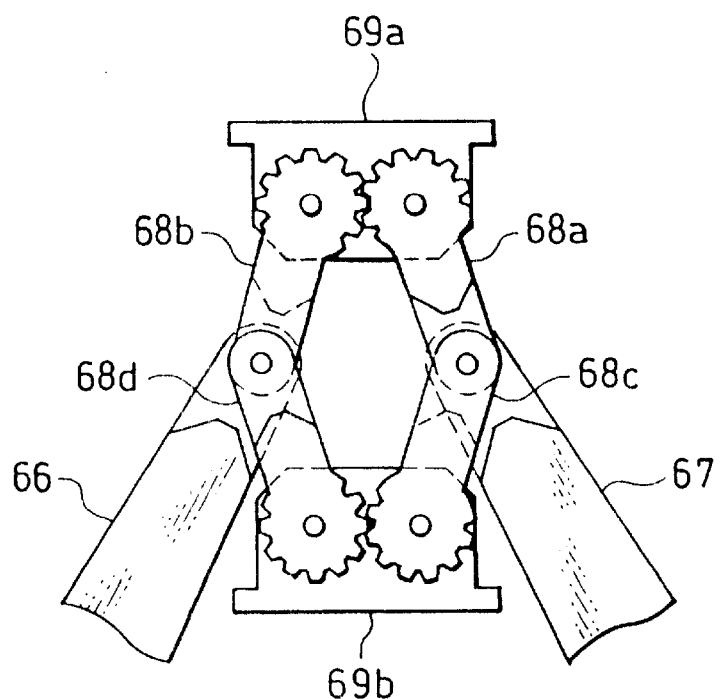

FIGS. 13A and 13B show forearm links, wherein FIG. 13A shows the status of forearm links in the case where the upper arms and the forearms are located in the stand by position; and FIG. 13B shows the status of the forearm links in the case where the upper arms and forearms are placed in an extended position. Two linking members 68a and 68c are coupled to forearm 67 with a pin, the tip end of linking member 68a is coupled to transfer hand 69a with a pin, and the tip end of linking member 68c is coupled to transfer hand 69b with a pin. Similarly, transfer hands 69a and 69b are supported with forearm 66 via linking members 68b and 68d. The configuration of each of linking members 68a,68b and linking members 68c,68d are such as to engage with gears so that they are rotated in transfer hands 69a and 69b synchronized with each other in opposite directions. However, the linking members may be restricted through friction by being provided with preliminary pressures or the gears may be replaced with a figure eight type belt. From the fact that these four forearm linking members 68a–68d function as links, each position of transfer hands 69a, 69b is restricted for any position taken by forearms 66,67.

Accordingly, a frog-legs line arm arrangement whose motion is bidirectional when driven by two coaxial shafts, can be provided through a combination of four forearms and upper arms with forearm links and transfer hands.

Figure 14:
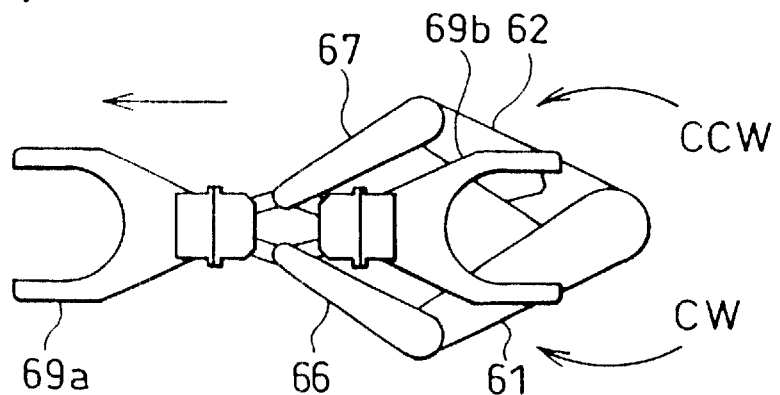
FIG. 14 is a drawing depicting operation of the embodiment of FIG. 4.
Figure 15:
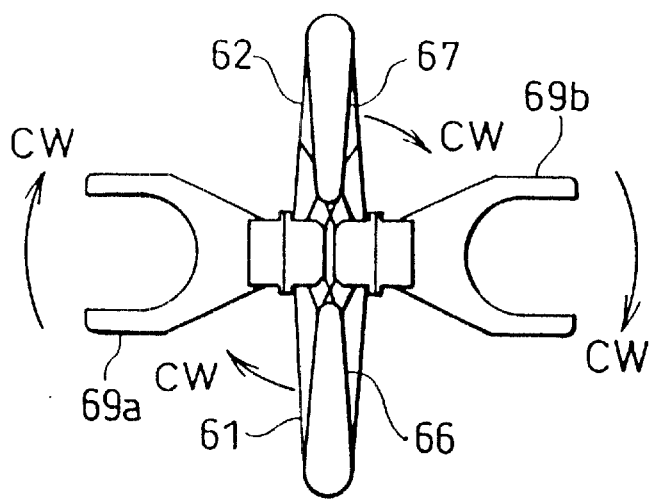
FIG. 15 is a drawing depicting operation of the embodiment of FIG. 4.
Figure 16:
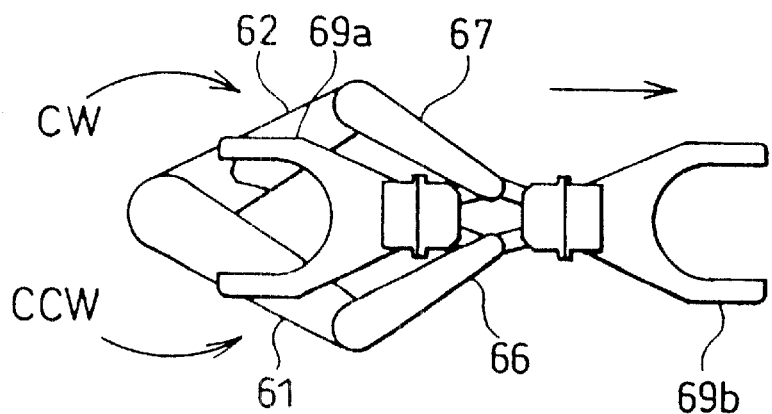
FIG. 16 is a drawing depicting operation of the embodiment of FIG. 4

FIGS. 14–16 show the direction of motion of transfer hands against the rotating direction of the upper arms, wherein in FIG. 14, when upper arm 61 is rotated clockwise (CW) and upper arm 62 is rotated counterclockwise (CCW), transfer hand 69a is operated in its extended direction. In FIG. 15, upper arms 61,62 are rotated in the same direction (e.g. in clockwise direction), and transfer hands 69a, 69b are rotated in the same direction as upper arms 61,62 around the rotating shafts of the upper arms. The case is shown of rotating in the standby position where the upper arms and the forearms overlap each other. In FIG. 16, when upper arm 61 is rotated counterclockwise (CCW) and upper arm 62 is rotated clockwise (Cw), transfer hand 69b is operated in its extended direction.

As discussed, a frog-legs like arm arrangement, whose motion is bidirectional and driven by two coaxial shafts, can be operated and arbitrarily determine each extended direction of transfer hands 69a, 69b and the direction in which the entire arm is rotated, by combining the rotating directions of upper arms 61,62. This causes two wafers to be transferred in turn.

When operating either by extending the frog-legs like arm or by rotating the arm, the torque required for each output power shaft or a two shaft motor becomes ½. This is because two drive shafts that drive the two upper arms 61,62 share the load by always being drive concurrently. Thus, a smaller output motor can be used in the invention.

Figure 17:
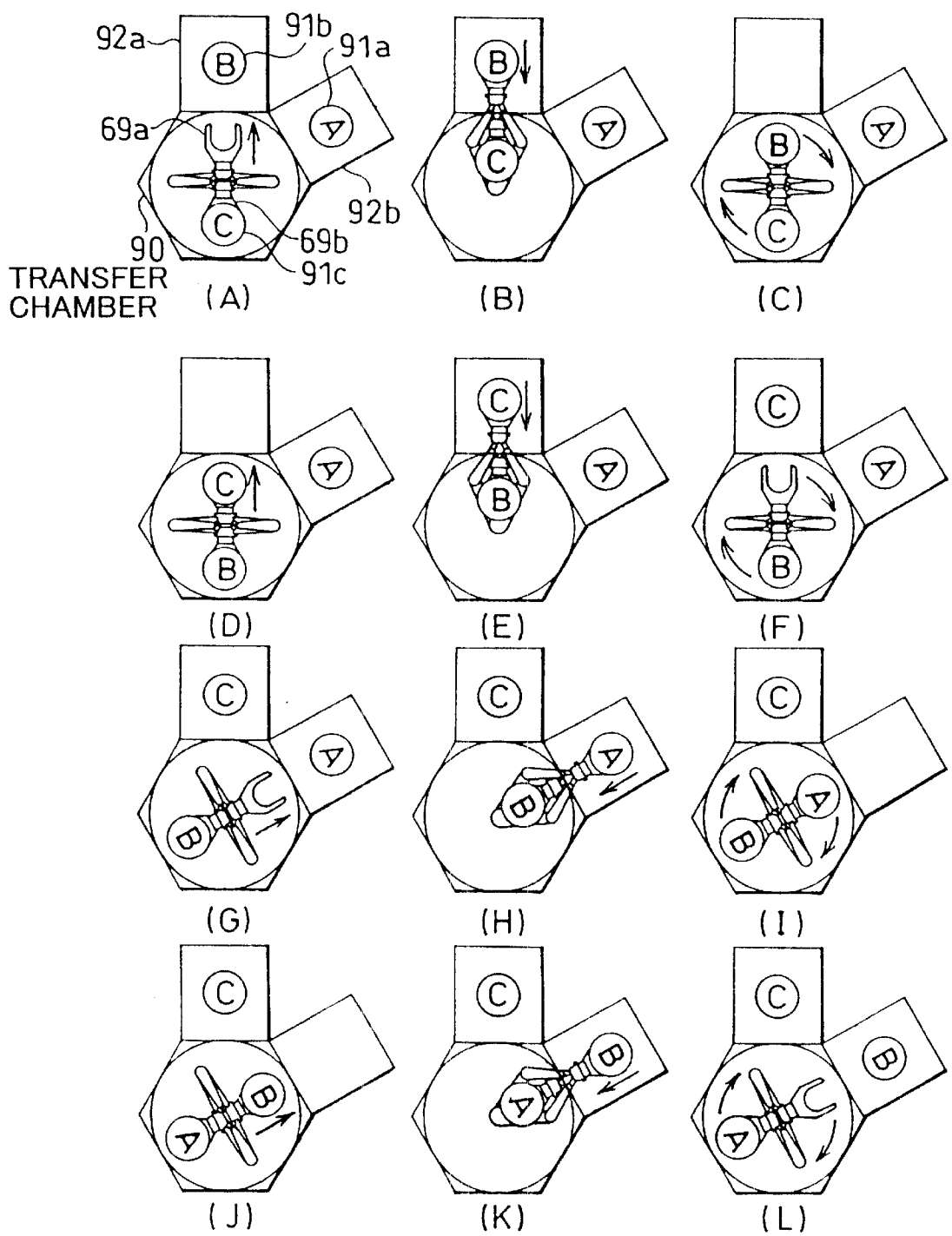
FIG. 17 are drawings depicting an example of transfer operation wherein wafers are transferred from one process to another.

FIG. 17 shows transfer sequence when transferring wafers during manufacture. In FIG. 17, item (A), the transfer arm of the invention is positioned at the center of the transfer chamber 90, and a state is shown, wherein first and second wafers 91a, 91b (called wafer A and wafer B) are subjected to semiconductor processing treatments, e.g. in second processing cell 92b and first processing cell 92a, respectively. These processing treatment cells are radially arranged at different angles to the center of transfer chamber 90. The sequence of the processings is such that the first process is located on the upstream side and the second process is located on the downstream side. The process stream is directed from wafer B to wafer A. The transfer arm has a third wafer 91c (called wafer C) on transfer hand 69b in the condition of the standby position.

In FIG. 17, the items labeled (A) to (L) show the following treatments: Items(A) and (B), wafer B in a first cell is unloaded; Items (C) and (D), wafer C is indexed to the first cell; Items (D) and (E), wafter C is loaded in the first cell; Items (F) and (G), an empty transfer hand is indexed to a second cell; Items (G) and (H), wafer A is unloaded; Items (I) and (J), wafer B is indexed to the second cell; Items (J) and (K), wafer B is loaded to the second cell; and Item (L), an empty transfer hand is indexed to the next cell.

By repeating the foregoing steps, wafers are transferred to each process according to a predetermined sequence. Although transfer over two processes is described, as an example, the invention is not restricted to such number of transfer processes. Any number of processes for transfer objects may be provided, and the direction of transfer and transfer sequence ca be made arbitrarily.

The embodiments of the embodiment, such as shown in FIGS. 4–17 provide the following effects and advantages.

(1) Since the drive shafts are directly coupled to the output power shafts of the motor, the transmission mechanism is simplified, vacuum sealing is easy to provide for applications in an evacuated environment, and simple construction enables easy, simple, and reliable maintenance.

(2) Since the centers of rotation of the upper arms are arranged in a coaxial manner, each bearing takes a configuration stacked on the drive shaft. This makes it possible to suitably select the diameter of the bearings for the different arms according to the load and without specific restrictions of the shaft diameter. Accordingly, a bearing assembly having suitable rigidity can be used in the invention, and the rigidity of the transfer system can be increased.

(3) When the first upper arm is rotated when driven by the first drive shaft, the second forearm is rotated in the same direction as the first upper arm rotation direction and the first forearm is rotated in the opposite direction, respectively, in association with the motion of the drive shaft. When the second upper arm is rotated when driven by the second drive shaft, the first forearm is rotated in the same direction as the second upper arm rotation and the second forearm is rotated in the opposite direction, respectively, in association with the motion of the drive shaft. Accordingly, operation of extending or contracting the transfer arm and of changing the orientation of the transfer arm can be performed by selecting the rotating direction of the first and second drive shafts. This makes it possible to use the same motor for extending or contracting the transfer arm and for changing the orientation of the transfer arm. Thus, the power required for transfer motion is reduced and the structure of the transfer system is simplified.

(4) Since the transmission means transmits power at the transmission ratio of 1:1, the upper arms and forearms positioned on opposite arms of the parallelogram can be rotated with that parallelism retained.

(5) Since the transmission means are provided on the sides nearer to the drive shafts than the base ends of the forearms, the forearms can be designed to be thinner. Thus, it is easier to meet the standards SEMI E21 and SEMI E22 in connection with arm dimensions.

(6) A transfer hand can be moved from a position on one side of the drive shafts to a position on the other side thereof when passing over the position of the drive shafts. This provides versatility to the transfer hands moving range, and hence, the attitude of the transfer hads, when resting in the standby position, can be such that the transfer hands and each arm project a minimum amount from the system. Accordingly, with the invention, it is possible to reduce the turning radius of the entire system.

(7) Two transfer hands can be mounted on the forearm links. Since the hands are arranged in different transfer directions from each other, when the transfer hands are applied to processing, they can hold a wafer to be loaded to a process treatment cell and a wafer that is unloaded from the process treatment cell, both at the same time. This improves transfer efficiency.

(8) Since each of the upper arms and forearms is arranged in a stacked manner and do not interfere with each other's range of movement when they are rotated, the width of each arm and forearm in the horizontal direction orthogonal to the rotating shaft are not specifically restricted. Thus, the arms and forearms can be set to widths corresponding to the load.

Figure 18:
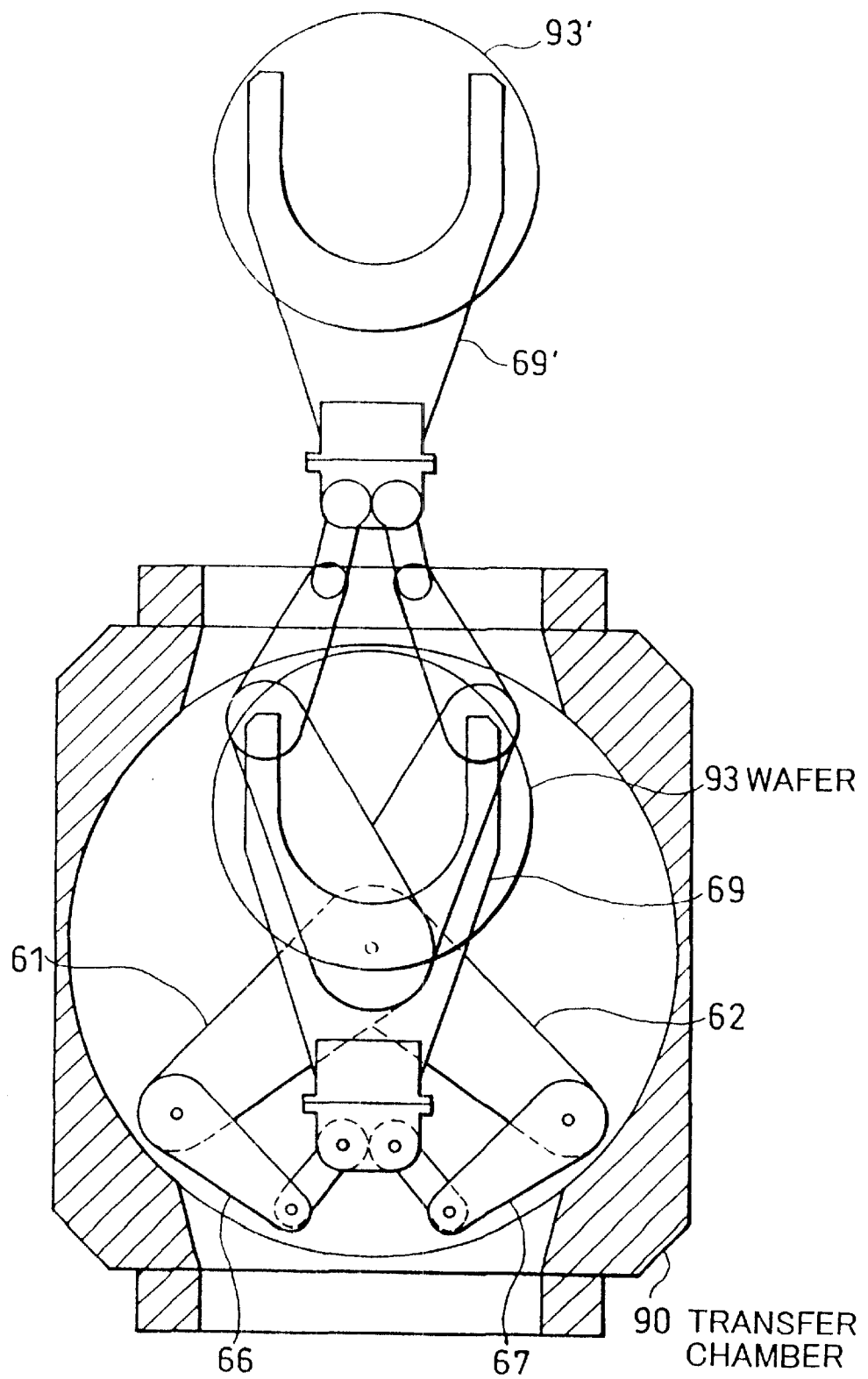
FIG. 18 is a drawing depicting another illustrative embodiment of the invention.

FIG. 18 shows another embodiment of the invention, wherein the transfer system occupies less space by providing only one transfer hand. In FIG. 18, the transfer system attitude in the withdrawn position is depicted, wherein the driving centers of upper arms 61,62 are located in the center of transfer chamber 90, and one transfer hand 69 which holds wafer 93 is arranged in the tip ends of forearms 66,67.

In addition, transfer hand 69' and wafer 93' drawing with chain double dotted lines show the arm extended position. In this embodiment, there is no transfer hand on one side. Hence, even when the arm withdrawn position attitude is such that the arms are withdrawn to a position in which wafer 93 overlaps the rotating center of the upper arms 61,62, the turning radius for the entire arms including the wafer can be made smaller. Accordingly, for cases where a set of transfer arms is used in combination with one process module that handles and processes semiconductors (called "single chamber system"), the positioning distances between adjacent processes can be reduced. Thus, a clean room, the are of which is expensive, can be more effectively utilized by reducing the area occupied by the transfer system. In particular a compact transfer system is provided for large scale wafers and moreover, with the invention, an effective transfer means for wafers having a large size is provided.

Advantageously, the invention provides transfer motions because the arms have suitable rigidity and provides a transfer system that is easy and economical to maintain and which conserves energy.

The foregoing description is illustrative of the principles of the invention. Numerous extensions and modifications thereof would be apparent to the worker skilled in the art. All such extensions and modifications are to be considered to be part and parcel of the invention.

What is claimed is:

1. A transfer system comprising:
   first and second upper arms, each having a tip end and a base end, said upper arms being provided at the base ends rotatably in a coaxial manner;
   first and second drive shafts arranged in a coaxial manner at said base ends of said first and second upper arms and connected to said base ends thereof for independently driving said first and second upper arms, respectively, said first and second drive shafts being directly coupled to an output power shaft of a motor;
   a first forearm having a base end and a tip end, said base end thereof being rotatably mounted by a first shaft on said tip end of said first upper arm;
   a second forearm having a base end and a tip end, said base end thereof being rotatably mounted by a second shaft on said tip end of said second upper arm;
   a forearm link connected to said tip ends of said first and second forearms;
   a transfer hand connected to said forearm link;
   first transmission means for transmitting power from said first drive shaft to said first forearm, said first transmission means comprising an endless belt connected to said first drive shaft and to said first shaft;
   second transmission means for transmitting power from said second drive shaft to said second forearm, said second transmission means comprising an endless belt connected to said second drive shaft and to said second shaft; wherein
   said transfer hand is movable; wherein
   said first forearm is rotated in a same direction as said second upper arm and said second forearm rotating in an opposite direction of rotation as second second upper arm in one condition; wherein
   said second forearm is rotated in a same direction of rotation as said first upper arm, and said first forearm is rotated in an opposite direction of rotation as said first upper arm in another condition; and wherein
   said transfer hand is movable in any selected direction through selective rotation of said first and second drive shafts.

2. The system of claim 1, wherein said first and second transmission means comprise means for transmitting power at a transmission ratio of 1:1 and wherein
   when said first upper arm is rotated, said second forearm is rotated in a same direction of, and said first forearm is rotated in an opposite direction of rotation of said first upper arm by a same angle as said first upper arm rotation angle; and wherein
   when said second upper arm is rotated, said first forearm is rotated in a same direction of, and said second forearm is rotated in an opposite direction of rotation of said second upper arm by a same angle as said second upper arm rotation angle.

3. The system of claim 1, wherein said first and second transmission mission means are provided on a side of a base end of said forearms nearer to drive shafts and transmit power between rotating centers of forearms and rotating centers of upper arms, respectively.

4. The system of claim 1, wherein said first and second upper arms are rotated in both clockwise and counterclockwise directions starting at a position whereat said first and second forearms overlap; and wherein said transfer hand is moved from a position on one side of said first and second drive shafts to a position on another side of said drive shafts passing over a position on said first and second drive shafts.

5. The system of claim 1, further comprising another transfer hand, and wherein the two transfer hands are connected to said forearm link, and wherein said two transfer hands are arranged in opposite directions to each other.

6. The system of claim 1, wherein said first and second upper arms and said first and second forearms are positioned in a stacked manner so that region of movement thereof does not interfere with each other when said first and second upper arms and said first and second forearms are rotated.

* * * * *